United States Patent
Fujimaki (10) Patent No.: US 7,205,587 B2
(45) Date of Patent: Apr. 17, 2007

(54) SEMICONDUCTOR DEVICE AND METHOD OF PRODUCING THE SAME

(75) Inventor: Hirokazu Fujimaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/191,190

(22) Filed: Jul. 28, 2005

(65) Prior Publication Data

US 2006/0046409 A1 Mar. 2, 2006

(30) Foreign Application Priority Data

Aug. 26, 2004 (JP) ............................. 2004-246374

(51) Int. Cl.
*H01L 31/00* (2006.01)
*H01L 21/8222* (2006.01)

(52) U.S. Cl. ..................... 257/197; 257/273; 438/311

(58) Field of Classification Search .............. 257/197, 257/273; 438/311
See application file for complete search history.

(56) References Cited

U.S. PATENT DOCUMENTS 6,521,974 B1 * 2/2003 Oda et al. ................... 257/593
6,936,910 B2 * 8/2005 Ellis-Monaghan et al. .. 257/552

FOREIGN PATENT DOCUMENTS

| JP | 6-69430 | 3/1994 |
|---|---|---|
| JP | 2001-274234 | 10/2001 |

* cited by examiner

Primary Examiner—Long Tran
(74) Attorney, Agent, or Firm—Takeuchi & Kubotera, LLP (57) ABSTRACT

A method of producing a semiconductor device includes the steps of: preparing a double SOI substrate, forming a deep trench, filling the deep trench, forming an opening, forming a cavity, depositing a polycrystalline silicon layer, and forming a bipolar transistor.

2 Claims, 7 Drawing Sheets

SEMICONDUCTOR DEVICE AND METHOD OF PRODUCING THE SAME

BACKGROUND OF THE INVENTION AND RELATED ART STATEMENT

The present invention relates to a semiconductor device and a method of producing the semiconductor device.

A bipolar transistor is capable of running at a high speed as compared with a MOSFET, and has a high current drive performance. Therefore, the bipolar transistor is suitable for an LSI for driving a laser for light transmission or a power amplifier of a cellular phone. When the bipolar transistors are mounted in a single chip together with MOSFETs capable of high density mounting, it is possible to obtain performance difficult to achieve in an LSI formed only of MOSFETs.

Figure 7:
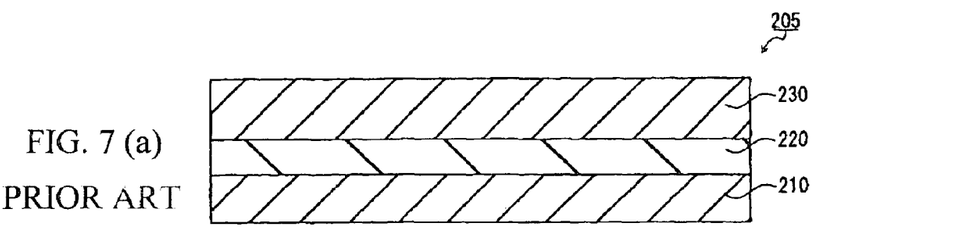
FIGS. 7(A) to 7(C) are views showing a conventional process of producing a BiCMOS.

A conventional process of producing a BiCMOS formed of bipolar transistors and CMOSs, i.e., p-type MSFETs and n-type MOSFETs, on a single chip will be explained with reference to FIGS. 7(A) to 7(C) (refer to Patent Reference 1). FIGS. 7(A) to 7(C) are views showing a conventional process of producing the BiCMOS.

A silicon oxide layer 220 is formed on a silicon substrate 210, and a single crystal silicon layer 230 is formed on the silicon oxide layer 220 to form an SOI substrate 205 (FIG. 7(A)). LOCOS layers 300 are formed in the single crystal silicon layer 230 for separating elements, so that the single crystal silicon layer 230 is divided into a single crystal silicon layer 238 in a MOSFET forming area 258 and a single crystal silicon layer 235 in a bipolar transistor forming area 255. After the LOCOS layers 300 are formed in the single crystal silicon layer 230 to form a structure shown in FIG. 7(A), an oxide layer 260 is deposited on an entire upper surface of the structure with CVD method, and the single crystal silicon layer 235 in the bipolar transistor forming area 255 is exposed (FIG. 7(B)).

A single crystal silicon layer 236 is formed on the single crystal silicon layer 235 in the bipolar transistor forming area 255 through selective epitaxial growth of silicon. After the single crystal silicon layer 236 is formed, a portion of the oxide layer 260 corresponding to the MOSFET forming area 258 is removed (FIG. 7(C)). Then, a MOSFET is formed on the single crystal silicon layer 238 in the MOSFET forming area 258, and a bipolar transistor is formed on the single crystal silicon layers 235 and 236 in the bipolar transistor forming area 255, thereby obtaining the BiCMOS.

In the method of forming the BiCMOS on the SOI substrate described above, a LOCOS layer for electrically separating the bipolar transistor tends to be shrunk during a heating process for forming elements such as MOSFET, thereby generating stress in an active area. In order to solve this problem, Patent Reference 2 has proposed a method of forming a BiCMOS using a substrate having a double SOI structure.

Patent Reference 1: Japanese Patent Publication (Kokai) No. 06-69430

Patent Reference 2: Japanese Patent Publication (Kokai) No. 2001-274234

In the manufacturing method using the substrate having the double SOI structure, it is possible to reduce stress in the active area, thereby obtaining a stable BiCMOS. However, when a vertical type bipolar transistor with high performance and high mounting density is produced, it is still difficult to reduce a collector resistance at a bottom portion thereof.

In view of the problems described above, an object of the present invention is to provide a method of producing a semiconductor device, in which it is possible to provide a low resistance layer with an appropriate shape at a bottom portion of a vertical type bipolar transistor.

Further objects and advantages of the invention will be apparent from the following description of the invention.

SUMMARY OF THE INVENTION

In order to attain the objects described above, according to the present invention, a method of producing a semiconductor device includes the steps of: preparing a double SOI substrate, forming a deep trench, filling the deep trench, forming an opening, forming a cavity, depositing a polycrystalline silicon layer, and forming a bipolar transistor.

In particular, in the step of preparing the double SOI substrate, a first oxide layer, a first single crystal silicon layer, a second oxide layer, and a second single crystal silicon layer are formed on a support substrate in this order to prepare the SOI substrate. In the step of forming the deep trench, the second single crystal silicon layer is etched down to a depth where the first oxide layer is exposed to form the deep trench for defining a bipolar transistor forming area. In the step of filling the deep trench, a silicon nitride layer and a silicon oxide layer are deposited on the double SOI substrate to fill the deep trench.

In the step of forming the opening, the bipolar transistor forming area is etched down to a depth where the second oxide layer is exposed. In the step of forming the cavity, the second oxide layer in the bipolar transistor forming area is removed with wet etching. In the step of depositing the polycrystalline silicon layer, the polycrystalline silicon layer is formed in the opening and the cavity communicating with each other. In the step of forming the bipolar transistor, the bipolar transistor is formed on the second single crystal silicon layer in the bipolar transistor forming area.

In the method of producing the semiconductor, in particular the bipolar transistor, the second oxide layer is removed to form the cavity, and the polycrystalline silicon layer is formed in the cavity. Accordingly, it is possible to form the polycrystalline silicon layer with an appropriate shape at a bottom portion of the second single crystal layer in the bipolar transistor forming area. With the polycrystalline silicon layer, it is possible to reduce a collector resistance of the bipolar transistor.

DETAILED DESCRIPTION OF PREFERRED EMBODIMENTS

Hereunder, embodiments of the present invention will be explained with reference to the accompanying drawings. A configuration and arrangement of an embodiment are schematically presented for explaining the invention. The embodiments will be explained with configurations (materials) and numerical conditions as preferred examples, and the invention is not limited thereto.

FIGS. 1(A) to 1(D) to 6(A) to 6(C) are views showing a process of producing a BiCMOS having a bipolar transistor and a CMOS both formed on a same single substrate as semiconductor devices. First, a double SOI substrate 5 having a double SOI structure is prepared. The double SOI substrate 5 has a laminated structure in which, on a semiconductor substrate 10 such as a silicon substrate, a first oxide layer 20, a first single crystal silicon layer 30, a second oxide layer 40, and a second single crystal silicon layer 50 are formed sequentially in this order. When the double SOI substrate 5 is prepared, a silicon layer with an oxide layer formed thereon for producing an SOI substrate may be attached to a semiconductor substrate twice. Alternatively, after a silicon layer with an oxide layer formed thereon is attached to a semiconductor substrate, SIMOX (separation by implanted oxygen) is performed in which oxygen is implanted in a single crystal silicon substrate at a high density.

In the embodiment, the first oxide layer 20 and the second oxide layer 40 have a thickness of about 200 nm. The first single crystal silicon layer 30 is an n+ type single crystal silicon layer with a thickness of about 3.0 µm, and the second single crystal silicon layer 50 is an n– type single crystal silicon layer with a thickness of about 500 nm (FIG. 1(A)).

In the next step, deep trenches 52 are formed in the double SOI substrate 5 in an area defining a bipolar transistor forming area 55 with lithography or dry etching. The deep trenches 52 have a width of about 500 nm, and a depth deep enough so that the first oxide layer 20 is exposed. Accordingly, the lamination including the first single crystal silicon layer 30 and the second single crystal silicon layer 50 is divided into several isolated areas by the deep trenches 52. After the deep trenches 52 are formed, a silicon nitride layer 60 with a thickness of about 15 nm is formed on a surface of the second single crystal silicon layer 50 and inner surfaces of the deep trenches 52 with CVD (chemical vapor deposition) method (FIG. 1(B)).

In the next step, a silicon oxide layer (TEOS film) 70 is formed using TEOS (tetraethyl-ortho-silicate) for filling the deep trenches 52 with low pressure CVD (LPCVD; low pressure CVD). The TEOS film 70 is formed with CVD method using TEOS having a good ability of covering. Accordingly, it is possible to filling the deep trenches 52 without a gap. At this time, the TEOS film 70 is formed at an upper portion of an upper surface of the second single crystal silicon layer 50 (FIG. 1(C)).

In the next step, the TEOS film 70 formed on the silicon nitride layer 60 on the upper surface of the second single crystal silicon layer 50 is removed with chemical mechanical polishing (CMP) to expose the silicon nitride layer 60 on the upper surface of the second single crystal silicon layer 50. At this time, a part of the TEOS film 70 remains in the deep trenches 52 as a remaining film (remaining TEOS film) 72 (FIG. 1(D)). It is preferred that the structure shown in FIG. 1(D) have a flat upper surface.

Figure 1:
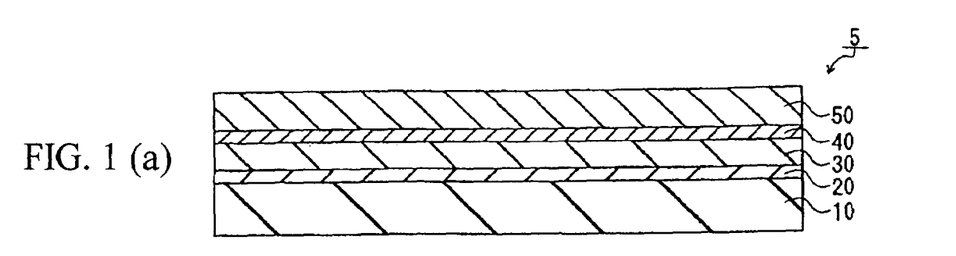
FIGS. 1(A) to 1(D) are views showing a process of producing a BiCMOS (No. 1)
Figure 2:
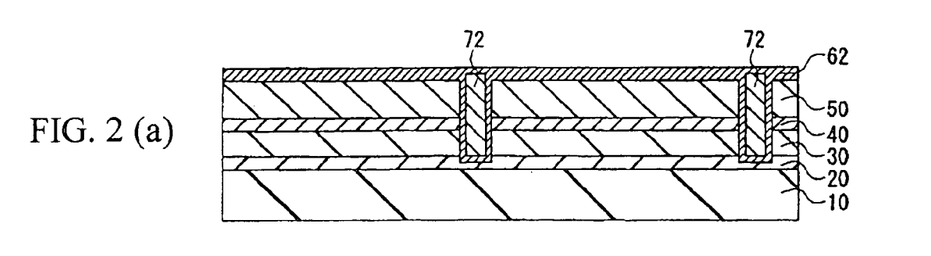
FIGS. 2(A) to 2(D) are views showing a process of producing a BiCMOS (No. 2)

In the next step, a silicon nitride layer with a thickness of about 30 nm is additionally formed on an entire upper surface of the structure shown in FIG. 1(D), so that a silicon nitride layer 62 with the silicon nitride layer 60 as a lower layer covers the upper surface (FIG. 2(A)).

In the next step, the silicon nitride layer 62 is patterned with lithography or dry etching to form an opening 54 for forming a collector in the bipolar transistor forming area 55. The dry etching is performed from a surface of the silicon nitride layer 62 down to a depth where the second oxide layer 40 is exposed (FIG. 2(B)).

In the next step, the second oxide layer 40 in the bipolar transistor forming area 55 is removed with wet etching using hydrogen fluoride (HF). The wet etching proceeds in a lateral direction up to the silicon nitride layer 62 in sidewalls 53 of the deep trenches 52. Accordingly, the second oxide layer 40 is removed at an area exposed to the opening 54 as well as an area extending under the second single crystal silicon layer 50 to form a cavity 56 for forming the collector (FIG. 2(C)).

In the next step, with the LPCVD method, an n+ polycrystalline silicon doped with arsenic (As) or phosphorus (P) at a high concentration is deposited on an entire upper surface of the structure shown in FIG. 2(C) to have a thickness of about 1.0 µm. During the deposition of the n+ polycrystalline silicon, the n+ polycrystalline silicon enters the area below the second single crystal silicon layer 50 in the cavity 56 and is deposited there, so that the opening 54 and the cavity 56 are filled with the n+ polycrystalline silicon. Then, through etching back, a top portion of the polycrystalline silicon filled in the opening 54 and the cavity 56 and exposed on a front surface and the upper surface of the silicon nitride layer 62 are flatten to form a single flat surface. Accordingly, an n+ polycrystalline silicon layer 80 is formed in the opening 54 and the cavity 56 to be an embedded collector layer of the bipolar transistor (FIG. 2(D)).

Alternatively, after the cavity 56 is filled with the n+ polycrystalline silicon, a metal such as tungsten (W) may be deposited to fill the opening 54 with CVD method. In this case, the metal is diffused into the second single crystal silicon layer 50, thereby reducing resistance of the second single crystal silicon layer 50.

Figure 3:
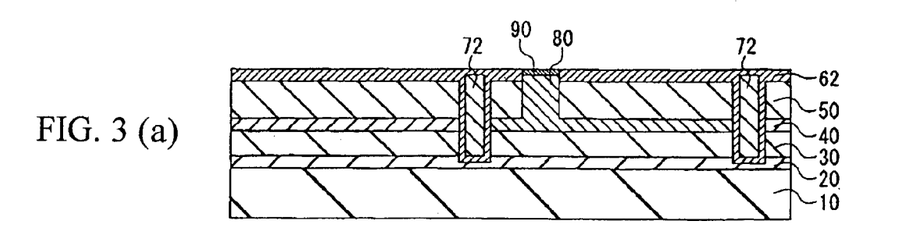
FIGS. 3(A) to 3(C) are views showing a process of producing a BiCMOS (No. 3)
Figure 4A:
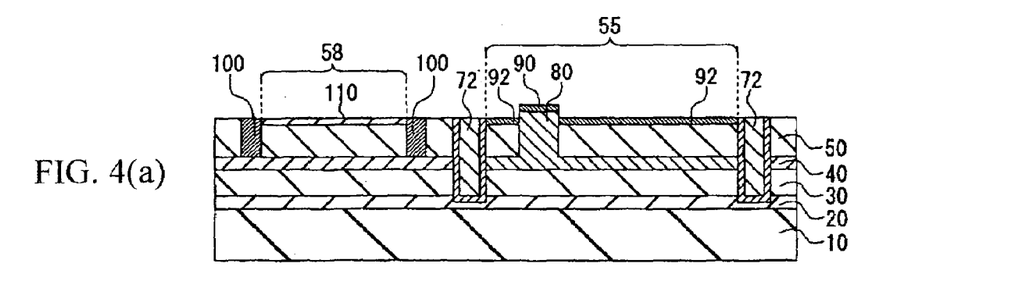
FIGS. 4(A) to 4(C) are views showing a process of producing a BiCMOS (No. 4)
Figure 4B:
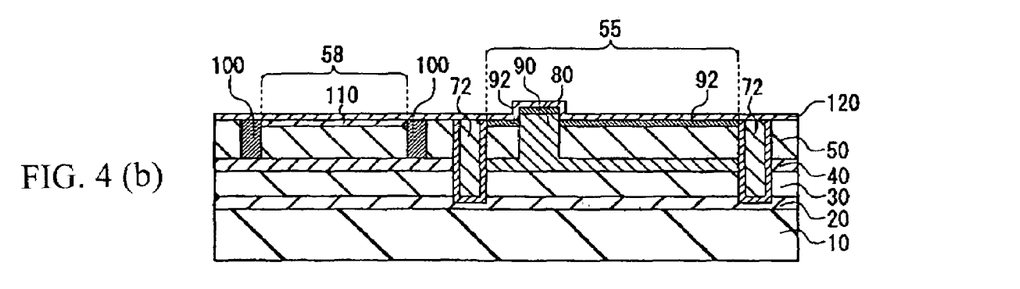
Figure 4C:
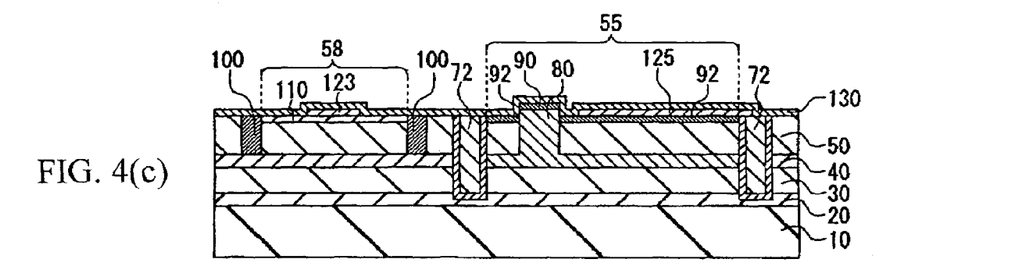

In the next step, the exposed surface of the n+ polycrystalline silicon layer 80, i.e., the top portion, is oxidized to form a cap oxide layer (surface protective layer) 90 (FIG. 3(A)). Then, known photolithography and dry etching are performed on an area defining an MOSFET forming area 58. Accordingly, the silicon nitride layer 62 and the second single crystal silicon layer 50 in the area are removed to form a shallow trench 59 exposing the second oxide layer 40. A silicon oxide layer fills in the shallow trench 59 with CVD method to form an element separation oxide film 100 (FIG. 3(B)).

In the next step, the silicon nitride layer 62 in the bipolar transistor forming area 55 is removed with known photolithography and dry etching to expose the second single crystal silicon layer 50. At this time, a part of the silicon nitride layer 62 remains. An exposed surface of the second single crystal silicon layer 50 is thermally oxidized to form a silicon thermal oxide film 92 with a thickness of about 50 nm (FIG. 3(C)). Then, the remaining silicon nitride film (62 in FIG. 3(C)) is completely removed. A gate oxide film 110 of the MOSFET is formed on a surface of the second single crystal silicon layer 50 in the MOSFET forming area 58 (FIG. 4(A)).

In the next step, a doping process is performed on the second single crystal silicon layer 50 in the MOSFET forming area 58. The type of ions implanted by the doping process depends on whether the MSFET becomes an N-type MOSFET or a p-type MOSFET. After the doping process, a polycrystalline silicon film 120 with a thickness of about 150 nm is formed on an entire upper surface of a structure shown in FIG. 4(A) with CVD method.

In the next step, the polycrystalline silicon film 120 is processed to form a gate electrode 123 of the MOSFET and a base electrode 125 of the bipolar transistor. Then, boron (B) is selectively doped into the base electrode 125 with ion implantation. Another doping process is performed on the MOSFET forming area 58 to form an LDD (lightly doped drain) with ion implantation. After doping the MOSFET forming area 58, a silicon nitride film 130 with a thickness of about 200 nm is formed on an entire supper surface of a structure shown in FIG. 4(B) with known CVD method (FIG. 4(C)).

Figure 5:
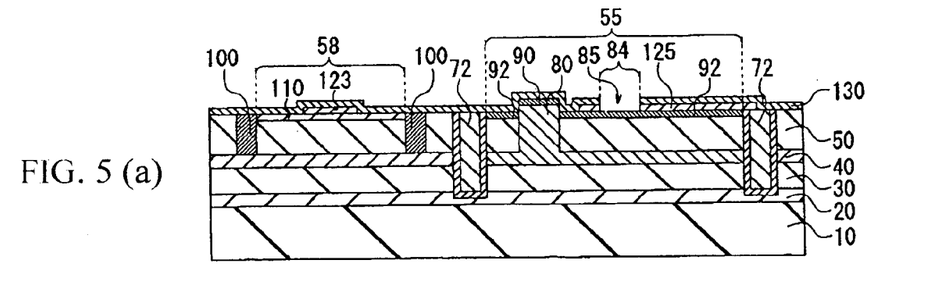
FIGS. 5(A) to 5(D) are views showing a process of producing a BiCMOS (No. 5)

In the next step, with known photolithography and dry etching, the silicon nitride film 130 and the base electrode 125 in an emitter electrode forming area 84 for forming an emitter electrode of the bipolar transistor are removed sequentially to form an opening for an emitter electrode opening 85, and the silicon thermal oxide film 92 is exposed (FIG. 5(A)). Then, the silicon thermal oxide film 92 in the emitter electrode forming area 84 is removed with wet etching using hydrogen fluoride (HF). In the wet etching, the silicon thermal oxide film 92 is removed in a self-aligning way. Also, though controlling an etching time of the wet etching, a sidewall of the emitter electrode opening 85 is etched laterally by about 200 nm. Accordingly, a cavity 86 for forming an emitter electrode is formed in a portion where the silicon thermal oxide film 92 is removed (FIG. 5(B)).

In the next step, silicon is selectively grown through epitaxial growth in the emitter electrode 85 and the emitter electrode cavity 86 to fill the emitter electrode opening 85. More specifically, silicon is selectively grown through epitaxial growth from a lower surface of an end of the base electrode 125 exposed with wet etching toward the second single crystal silicon layer 50 to form an epitaxial growth silicon layer 140. The epitaxially grown silicon is situated in the emitter electrode cavity 86 and fills a sandwiched area. The epitaxially grown silicon has a polycrystalline structure near the base electrode 125, and a single crystal structure near the second single crystal silicon layer 50. Then, a sidewall insulating film 94 made of silicon nitride is formed on a sidewall of the emitter electrode opening 85 with CVD method (FIG. 5(C)).

The epitaxial growth silicon layer 140 is a p-type conductive layer containing $5 \times 10^{18}$/cc of boron (B) as an impurity. As a result of the epitaxial growth, a portion around the second single crystal silicon layer 50 becomes the p-type. The epitaxial growth silicon layer 140 may be formed with known hetero epitaxial growth of SiGe to form a composite multiple layered structure including a SiGe layer as a part thereof. Then, a polycrystalline silicon layer doped with phosphorous at a high concentration is grown on an entire upper surface of a structure shown in FIG. 5(C). The polycrystalline silicon layer is processed to form an emitter electrode 150 (FIG. 5(D)).

Figure 6:
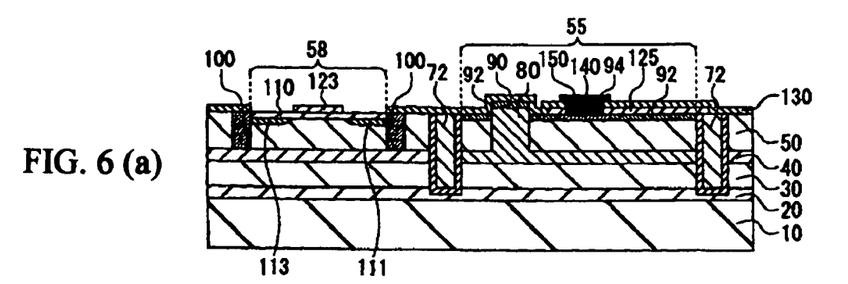
FIGS. 6(A) to 6(C) are views showing a process of producing a BiCMOS (No. 6)

In the next step, the silicon nitride film 130 in the MOSFET forming area 58 is removed, and ion implantation and activation annealing are performed with the gate electrode 123 as a mask to form a drain area 111 and a source area 113 of the MOSFET (FIG. 6(A)). Then, an intermediate insulating film 160 made of silicon oxide is formed with CVD method. A structure shown in FIG. 6(A) is thermally processed with lamp annealing (RTA; Rapid Thermal Annealing) at 900° C. for about 30 seconds. With the RTA, phosphorous in the emitter electrode 150 diffuses widely and shallowly into the epitaxial growth silicon layer 140 and a surface of the second single crystal silicon layer 50 contacting the epitaxial growth silicon layer 140 to form an active emitter 142. A p-type conductive portion of the second single crystal silicon layer 50 with no phosphorous diffused therein becomes a p-type active base 144. A portion of the epitaxial growth silicon layer 140 near the base electrode 125 with no phosphorous diffused therein also becomes the p-type active base 144 (FIG. 6(B)).

In the next step, contact holes for the source, drain, and gate electrodes of the MOSFET, and contact holes of the source, drain, and gate electrodes of the bipolar transistor (not shown) are formed in the intermediate insulating film 160, the silicon nitride film 130, and the cap oxide layer 90 at appropriate locations with known photolithography and dry etching, respectively. Tungsten (W) plugs are embedded in the contact holes to form contacts. The W plugs are used as a gate plug 171, a drain plug 172, and a source plug 173 of the MOSFET, and a gate plug 175, a drain plug 176, and a source plug 177 of the bipolar transistor (FIG. 6(C)). The W plugs are equivalent to metal electrodes of the MOSFET and bipolar transistor. After the W plugs are formed, a conductive pattern made of metal such as aluminum is formed on the intermediate insulating film 160, and electrically connected to an external circuit.

In the method of producing the bipolar transistor according to the present invention, the polycrystalline silicon is deposited in the cavity formed by removing the second oxide layer. Accordingly, it is possible to form the polycrystalline silicon with an appropriate shape at the bottom of the second single crystal silicon layer in the area defined by the deep trench. In the semiconductor device with the bipolar transistor, it is possible to reduce the collector resistance of the bipolar transistor with the polycrystalline silicon.

The disclosure of Japanese Patent Application No. 2004-246374, filed on Aug. 26, 2004, is incorporated in the application.

While the invention has been explained with reference to the specific embodiments of the invention, the explanation is illustrative and the invention is limited only by the appended claims.

What is claimed is:

1. A semiconductor device, comprising:
   a double SOI substrate having a first oxide layer, a first single crystal silicon layer, a second oxide layer, and a second single crystal silicon layer formed on a support substrate in this order to prepare; and
   a bipolar transistor formed on the double SOI substrate in an area defined by a deep trench extending to the first oxide layer,
   wherein said bipolar transistor has a polycrystalline silicon layer formed in an opening in the second silicon single crystal layer and a cavity where the second oxide layer is removed, a collector electrode electrically connected to the polycrystalline silicon layer, a base electrode electrically connected to the second silicon single crystal layer, and an emitter electrode electrically connected to the base electrode via the second silicon single crystal layer.

2. A semiconductor device according to claim 1, further comprising, an element separation oxide film formed in the second single crystal silicon layer in an area where the deep trench is not formed and outside the area defined by the deep trench, and an MOSFET formed in an area defined by an element separation insulating film.

* * * * *